(12) United States Patent
Qin

(10) Patent No.: US 10,651,241 B2
(45) Date of Patent: May 12, 2020

(54) FLEXIBLE OLED DISPLAY HAVING A HINGE STRUCTURE

(71) Applicant: Wuhan China Star Optoelectronics Semiconductor Display Technology Co., Ltd., Wuhan (CN)

(72) Inventor: Xuesi Qin, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/092,447

(22) PCT Filed: Aug. 24, 2018

(86) PCT No.: PCT/CN2018/102257
§ 371 (c)(1),
(2) Date: Oct. 10, 2018

(87) PCT Pub. No.: WO2020/006844
PCT Pub. Date: Jan. 9, 2020

(65) Prior Publication Data
US 2020/0013830 A1    Jan. 9, 2020

(51) Int. Cl.
| H01L 29/08 | (2006.01) |
| H01L 33/00 | (2010.01) |
| H01L 31/0232 | (2014.01) |
| H01L 51/40 | (2006.01) |
| H01L 27/32 | (2006.01) |
| H01L 51/52 | (2006.01) |
| H01L 51/00 | (2006.01) |
| G06F 1/16 | (2006.01) |

(52) U.S. Cl.
CPC ............ *H01L 27/32* (2013.01); *G06F 1/1681* (2013.01); *H01L 27/3244* (2013.01); *H01L 51/0097* (2013.01); *H01L 51/5253* (2013.01); *H01L 2251/5338* (2013.01)

(58) Field of Classification Search
CPC . H01L 27/32; H01L 51/0097; H01L 51/5253; H01L 27/3244; G06F 1/1681
See application file for complete search history.

(56) References Cited

U.S. PATENT DOCUMENTS

| 2008/0253073 A1* | 10/2008 | Kee ........................ G06F 1/1616 |
| | | 361/679.04 |
| 2012/0044620 A1* | 2/2012 | Song ..................... G06F 1/1616 |
| | | 361/679.01 |
| 2013/0010405 A1* | 1/2013 | Rothkopf ............ H04M 1/0216 |
| | | 361/679.01 |
| 2015/0085433 A1* | 3/2015 | Kim ...................... G06F 1/1641 |
| | | 361/679.01 |

(Continued)

Primary Examiner — Alonzo Chambliss

(57) ABSTRACT

A flexible organic light emitting diode (OLED) display is provided. The flexible OLED display includes: a flexible OLED display panel, a supporting frame, a buffer layer, wherein a hinge structure is disposed at a bent region of the supporting frame, the hinge structure comprises a first protective component, a hinge, and a second protective component; the hinge is disposed between the first protective component and the second protective component; the second protective component is flush with the first protective component when the flexible OLED display panel is in a planar state.

16 Claims, 2 Drawing Sheets

(56) References Cited

U.S. PATENT DOCUMENTS

2016/0116944 A1* 4/2016 Lee .................... H04M 1/022
   361/679.26
2016/0195901 A1* 7/2016 Kauhaniemi ......... G06F 1/1652
   361/679.27
2019/0018459 A1* 1/2019 Hong ................ E05D 11/0054

* cited by examiner

FLEXIBLE OLED DISPLAY HAVING A HINGE STRUCTURE

RELATED APPLICATIONS

This application is a National Phase of PCT Patent Application No. PCT/CN2018/102257 having International filing date of Aug. 24, 2018, which claims the benefit of priority of Chinese Patent Application No. 201810734251.0 filed on Jul. 6, 2018. The contents of the above applications are all incorporated by reference as if fully set forth herein in their entirety.

FIELD AND BACKGROUND OF THE INVENTION

The present invention relates to field of display technologies, and more particularly to a flexible OLED display.

Currently, flexible organic light emitting diode (OLED) displays are gradually attracting attention and is generally considered to be the next generation mainstream display. However, OLED panels still have obvious defects, such as a much shorter lifetime than liquid crystal displays, which seriously affects application of OLED panels.

Nowadays, the application of OLED display is still limited to a static bending stage. For example, mobile phones (S8 or S8 plus), mass-produced by SAMSUNG, as well as IPHONE X mobile phones of APPLE, have not achieved real flexibility, at least there is no dynamic bending flexible OLED screen that is mass-produced. Therefore, flexible OLEDs is still the most promising research direction in a long-term phase.

In summary, existing flexible OLED displays are limited to the static bending stage, which leads to the technical problem that flexible OLED displays are vulnerable to damage and have a low lifespan, in the dynamic bending stage.

The existing flexible OLED display is limited to the static bending stage, which leads to easy damage and low lifetime when the flexible OLED display is in the dynamic bending stage.

SUMMARY OF THE INVENTION

In order to solve the above-mentioned problems, the technical solutions provided by the present invention are as follows:

The present invention provides a flexible OLED display. The flexible OLED display includes a flexible OLED display panel, a supporting frame, and a buffer layer;

wherein, the supporting frame having a bent region and an unbent region, a hinge structure is disposed at the bent region of the supporting frame, the hinge structure includes a first protective component, a hinge, and a second protective component, the hinge is disposed between the first protective component and the second protective component, and the second protective component is flush with the first protective component when the flexible OLED display panel is in a planar state, and wherein a length of the first protective component is less than a length of the bent region, and a length of the second protective component is greater than the length of the bent region.

In the flexible OLED display provided by the embodiment of the present application, the first protective component is disposed on a surface of the flexible OLED display panel facing the supporting frame, and two ends of the first protective component are respectively mounted on the supporting frame.

In the flexible OLED display provided by the embodiment of the present application, the second protective component is disposed on a surface of the buffer layer facing the supporting frame, and two ends of the second protective component are respectively mounted on the supporting frame.

In the flexible OLED display provided by the embodiment of the present application, a thickness of the first protective component is same as a thickness of the second protective component.

In the flexible OLED display provided by the embodiment of the present application, a material of each of the first protective component and the second protective component is a shaped-memory alloy.

In the flexible OLED display provided by the embodiment of the present application, the shaped-memory alloy includes one of a gold cadmium alloy, a silver cadmium alloy, and a titanium nickel alloy.

In the flexible OLED display provided by the embodiment of the present application, a material of the hinge is a high-grade spring steel or a high elastic polymer.

In the flexible OLED display provided by the embodiment of the present application, the hinge includes a support component and an axial component. The support component is fixedly connected to a side of the supporting frame, and the axial component is fixedly connected to a surface of the support component.

In the flexible OLED display provided by the embodiment of the present application, a shape of the axial component is spring-like.

The present invention further provides a flexible OLED display. The flexible OLED display includes a flexible OLED display panel, a supporting frame, and a buffer layer;

wherein, the supporting frame having a bent region and an unbent region; a hinge structure is disposed at the bent region of the supporting frame, the hinge structure includes a first protective component, a hinge, and a second protective component, the hinge is disposed between the first protective component and the second protective component, and the second protective component is flush with the first protective component when the flexible OLED display panel is in a planar state.

In the flexible OLED display provided by the embodiment of the present application, the first protective component is disposed on a surface of the flexible OLED display panel facing the supporting frame, and two ends of the first protective component are respectively mounted on the supporting frame.

In the flexible OLED display provided by the embodiment of the present application, the second protective component is disposed on a surface of the buffer layer facing the supporting frame, and two ends of the second protective component are respectively mounted on the supporting frame.

In the flexible OLED display provided by the embodiment of the present application, a thickness of the first protective component is same as a thickness of the second protective component.

In the flexible OLED display provided by the embodiment of the present application, a material of each of the first protective component and the second protective component is a shaped-memory alloy.

In the flexible OLED display provided by the embodiment of the present application, the shaped-memory alloy includes one of a gold cadmium alloy, a silver cadmium alloy, and a titanium nickel alloy.

In the flexible OLED display provided by the embodiment of the present application, a material of the hinge is a high-grade spring steel or a high elastic polymer.

In the flexible OLED display provided by the embodiment of the present application, the hinge includes a support component and an axial component. The support component is fixedly connected to a side of the supporting frame, and the axial component is fixedly connected to a surface of the support component.

In the flexible OLED display provided by the embodiment of the present application, a shape of the axial component is spring-like.

The present invention is that the flexible OLED display provided by the present invention provides a novel hinge structure hinge structure disposed in the supporting frame in the bent region, which provides a space for the margin of the OLED display panel to be bent. The dynamic bending of the flexible OLED display is further realized and the throughput of the dynamic bending flexible OLED display is further improved.

BRIEF DESCRIPTION OF THE SEVERAL VIEWS OF THE DRAWINGS

In order to more clearly illustrate the technical solutions in the embodiments or the prior art, the following drawings, which are intended to be used in the description of the embodiments or the prior art, will be briefly described. It will be apparent that the drawings and the following description are only some embodiments of the present invention. Those of ordinary skill in the art may, without creative efforts, derive other drawings from these drawings.

DETAILED DESCRIPTION OF PREFERRED SPECIFIC EMBODIMENTS OF THE INVENTION

Figure 1:
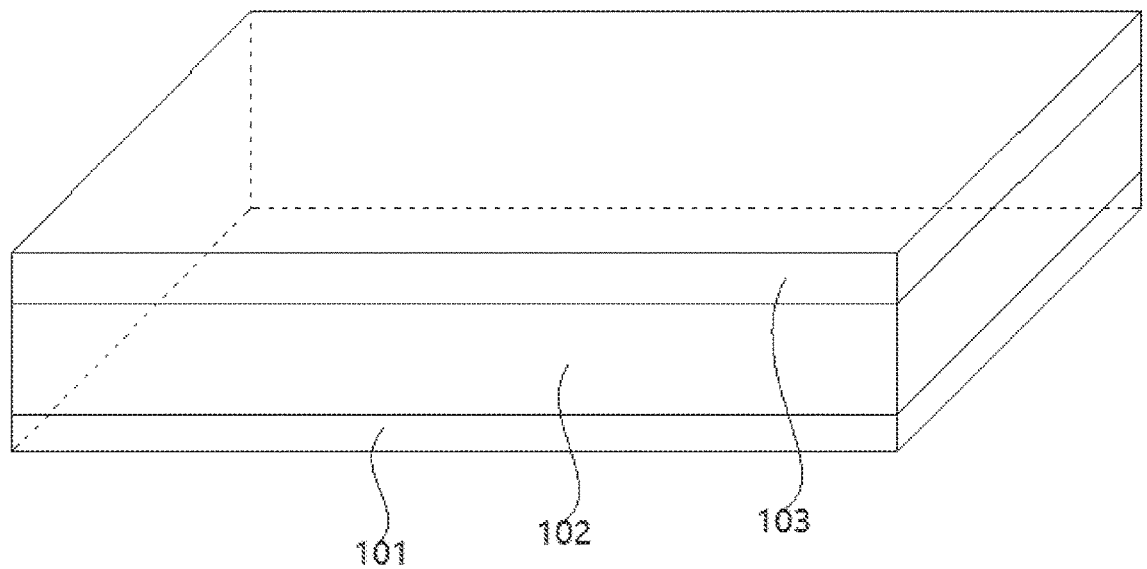
FIG. 1 is a schematic structural view of a flexible OLED display of the present invention.

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", "left", "right", "inside", "outside", "side", etc., is used with reference to the orientation of the figure(s) being described. As such, the directional terminology is used for purposes of illustration and is in no way limiting. Throughout this specification and in the drawings like parts will be referred to by the same reference numerals.

The present invention is directed against the existing flexible OLED display. Due to the existing flexible OLED display is limited to the static bending stage which leads to the technical problem that flexible OLED display is vulnerable to damage and has a low lifetime, in the dynamic bending stage. The present embodiment can solve the drawback.

As shown in FIG. 1, the present invention provides a flexible OLED display, wherein the flexible OLED display of the present invention can be used for dynamic bending. The flexible OLED display of the present invention includes a flexible OLED display panel 103, a supporting frame 102, and a buffer layer 101.

Wherein the supporting frame 102 is disposed on a surface of the buffer layer 101, and the flexible OLED display panel is disposed on a surface of the supporting frame 102.

Figure 2:
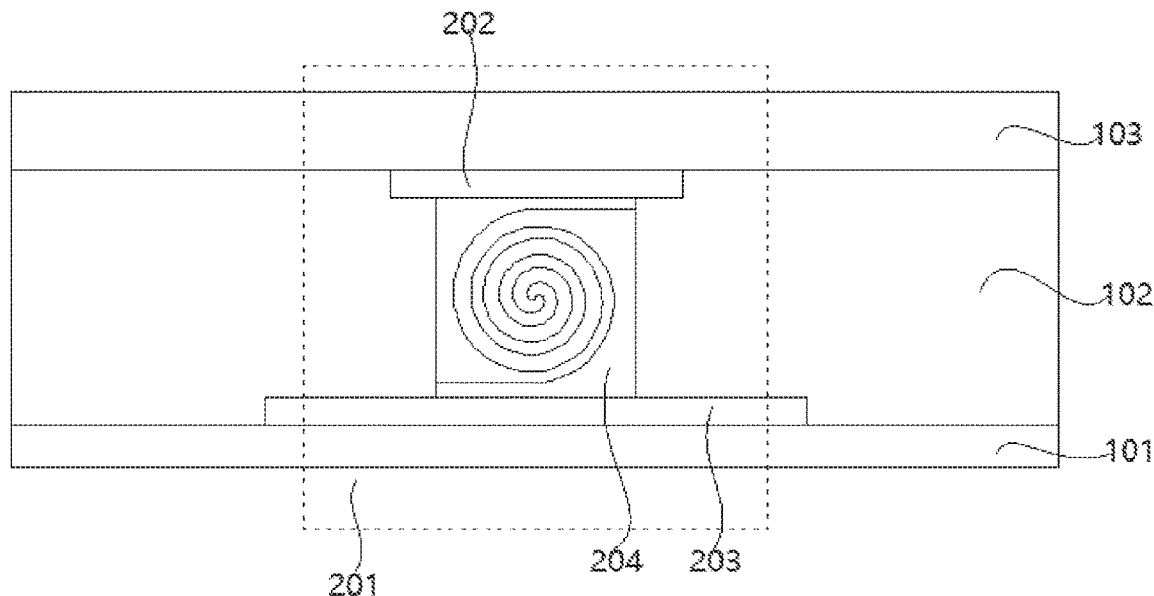
FIG. 2 is a cross-sectional view of a flexible OLED display in a planar state of the present invention.

As shown in FIG. 2, a cross-sectional view of the flexible OLED display of the present invention in a planar state is shown. The supporting frame 102 has a bent region 201 and an unbent region. The bent region 201 is disposed at a center location of the supporting frame 102.

Wherein a hinge structure is disposed at the bent region 20, and the hinge structure includes a first protective component 202, a hinge 204, and a second protective component 203. The hinge 204 is disposed between the first protective component 202 and the second protective component 203. The second protective component 203 is flush with the first protective component 202 when the flexible OLED display panel 103 is in a planar state.

The material of the first protective component 202 and the second protective component 203 is a shaped-memory alloy. Preferably, the shaped-memory alloy can adopt an alloy such as Au—Cd, Ag—Cd, Ti—Ni, or the like having a whole shaped-memory effect. Because of the existence of the shaped-memory alloy, the frame plays the role of pulling the panel to bend during the bending process and avoids panel stress caused by an uneven force to damage the panel. At the same time, the bending shape is ensured so as to avoid the damage of the panel by misfolding. The length of the first protective component 202 is less than the length of the bent region 201, and the length of the second protective component 203 is greater than the length of the bent region 201. The first protective component is disposed on a surface of the flexible OLED display panel 103 facing the supporting frame 102, and two ends of the first protective component 202 are respectively mounted on the supporting frame 102. The second protective component 203 is disposed on a surface of the buffer layer 101 facing the supporting frame 102, and two ends of the second protective component 203 are respectively mounted on the supporting frame 102.

When the flexible OLED display is in a planar state, the bent region support component is a hinge 204, and the hinge 204 is in a relatively relaxed state.

Figure 3:
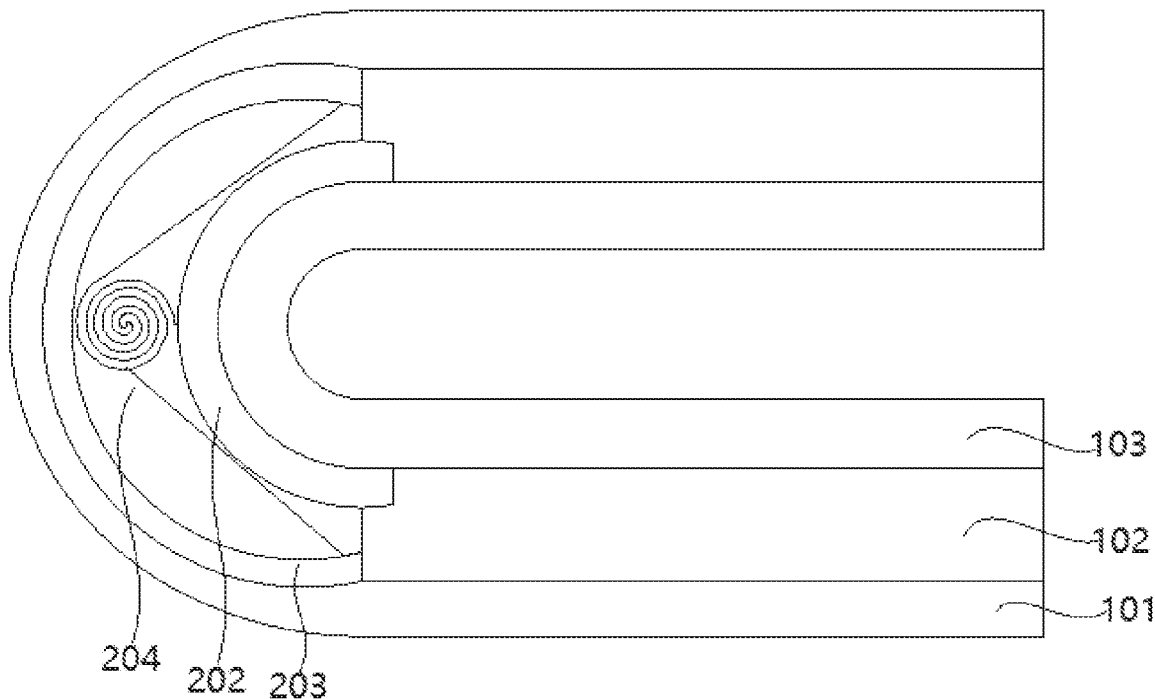
FIG. 3 is a cross-sectional view of a flexible OLED display in a bent state of the present invention.

As shown in FIG. 3, the flexible OLED display of the present invention is in a cross-sectional view in a bent state. The first protective component 202 and the second protective component 203 are both in a bent state. During the bending process, the hinge 204 is gradually tightened and shrink due to the pulling force of the supporting frame 102 on the two sides to the intermediate bending axis. At the same time, a space is provided for the margin formed by the bending of the flexible OLED display panel 103.

The hinge 204 has elasticity, and the material of the hinge 204 is high-grade spring steel or high elastic polymer. Preferably, the hinge may be a high-grade spring steel such as a silicon manganese system or a chromium manganese system. Preferably, the hinge 204 may use a polymer having better elasticity such as rubber.

When the flexible OLED panel 103 is in a bent state, the first protective component 202 can avoid the hinge 204 from injuring the flexible OLED panel 103 during operation. On the other hand, the flexible OLED panel 103 that is dynamically bent can be shaped to avoid the bent region 201 of the flexible OLED panel 103 from being offset and damaging the flexible OLED panel 103. The function of the second protective component 203 is mainly to protect the hinge 204 from contamination and has a shaping effect to ensure a dynamic bending shape so as to reduce the folding damage of the flexible OLED panel 103, at the same time. The supporting frame 102 plays the role of pulling the flexible OLED panel 103 to bend, so as to avoid a panel stress of the flexible OLED panel 103 caused by an uneven force to damage the flexible OLED panel 103. At the same time, the bending shape is ensured so as to avoid the damage of flexible OLED panel 103 by mis-folding or the like.

Figure 4:
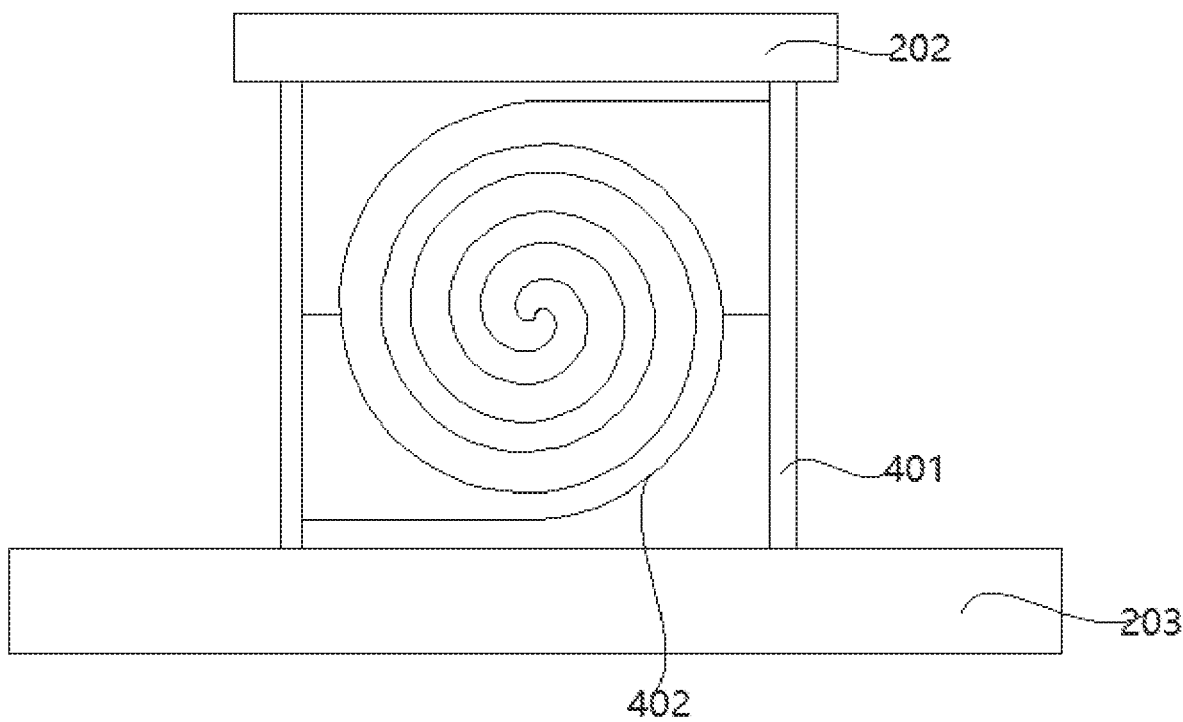
FIG. 4 is a schematic view of a hinge structure in a flexible OLED display of the present invention.

As shown in FIG. 4, the hinge 204 in the flexible OLED display of the present invention includes a support component 401 and an axial component 402. The support component 401 is fixedly connected to a side of the supporting frame 102. The axial component 402 is fixedly connected to a surface of the support component 401. The shape of the axial component 402 is spring-like.

When assembling the flexible OLED display of the present invention, the supporting frame 102 is first disposed at a lower surface of the flexible OLED panel 103, and then the buffer layer 101 is deposited at a lower surface of the supporting frame 102. The support frame 102 can be manufactured by combining the left and right parts. First, the support component 401 is welded on a side of the supporting frame 102 located on the bent region 201, the surface of the support component 401 is fixedly connected to a portion of the axial component 402. The left end of the first protective component 202 is respectively mounted on and fixedly connected to an upper surface of the supporting frame 102 and the support component 401 to form a left side of the supporting frame 102. The right end of the second protective component 203 is respectively mounted on and fixedly connected to the lower surface of the supporting frame 102 and the support component 401 of the right side to form a right side of the supporting frame 102.

The hinge 204 and the supporting frame 102, and the first protective component 202 and the process frame may be connected by welding, gluing or the like. After the two ends of the supporting frame 102 are completely assembled, the connection between the first protective component 202 and the supporting frame 102 and the connection between the second protective component 203 and the supporting frame 102 are completely protected. A novel whole frame is formed, and the supporting frame 101 is obtain. In this way, the flexible OLED display of the present invention has the structure of the hinge 204 in the dynamic bent region, so that during the bending process, the hinge 204 is gradually tightened and shrink due to the pulling force of the support component 401 on the two sides to the intermediate bending axial component 402. At the same time, a space is provided for the margin formed by the bending of the flexible OLED display panel 103.

The beneficial effect of the present invention is that the flexible OLED display provided by the present invention provides a novel hinge structure hinge structure disposed in the supporting frame in the bent region, which provides a space for the margin of the OLED display panel to be bent. The dynamic bending of the flexible OLED display is further realized and the throughput of the dynamic bending flexible OLED display is further improved.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A flexible organic light emitting diode (OLED) display, comprising:
    a flexible OLED display panel;
    a supporting frame, the supporting frame having a bent region and an unbent region; and
    a buffer layer, wherein the supporting frame is disposed on a surface of the buffer layer, and the flexible OLED display panel is disposed on a surface of the supporting frame;
    wherein a hinge structure is disposed at the bent region of the supporting frame, the hinge structure comprises a first protective component, a hinge, and a second protective component; the hinge is disposed between the first protective component and the second protective component, and the second protective component is flush with the first protective component when the flexible OLED display panel is in a planar state, and wherein a length of the first protective component is less than a length of the bent region, and a length of the second protective component is greater than the length of the bent region,
    wherein a material of each of the first protective component and the second protective component is a shaped-memory alloy.

2. The flexible OLED display according to claim 1, wherein the first protective component is disposed on a surface of the flexible OLED display panel facing the supporting frame, two ends of the first protective component are respectively mounted on the supporting frame.

3. The flexible OLED display according to claim 1, wherein the second protective component is disposed on a surface of the buffer layer facing the supporting frame, and two ends of the second protective component are respectively mounted on the supporting frame.

4. The flexible OLED display according to claim 1, wherein a thickness of the first protective component is same as a thickness of the second protective component.

5. The flexible OLED display according to, claim 1 wherein the shaped-memory alloy comprises one of a gold cadmium alloy, a silver cadmium alloy, and a titanium nickel alloy.

6. The flexible OLED display according to claim 1, wherein a material of the hinge is a high-grade spring steel or a high elastic polymer.

7. The flexible OLED display according to claim claim 1 wherein the shaped-memory alloy comprises one of a gold cadmium alloy, a silver cadmium alloy, and a titanium nickel alloy.

8. The flexible OLED display according to claim 6, wherein the hinge comprises a support component and an axial component, the support component is fixedly connected to a side of the supporting frame, and the axial component is fixedly connected to a surface of the support component.

9. The flexible OLED display according to claim 8, wherein a shape of the axial component is spring-like.

10. A flexible organic light emitting diode (OLED) display, comprising:
    a flexible OLED display panel;
    a supporting frame, the supporting frame having a bent region and a unbent region; and a buffer layer, wherein the supporting frame is disposed on a surface of the buffer layer, and the flexible OLED display panel is disposed on a surface of the supporting frame;

wherein a hinge structure is disposed at the bent region of the supporting frame, the hinge structure comprises a first protective component, a hinge, and a second protective component, the hinge is disposed between the first protective component and the second protective component, and the second protective component is flush with the first protective component when the flexible OLED display panel is in a planar state, wherein a material of each of the first protective component and the second protective component is a shaped-memory alloy.

11. The flexible OLED display according to claim 10, wherein the first protective component is disposed on a surface of the flexible OLED display panel facing the supporting frame, and two ends of the first protective component are respectively mounted on the supporting frame.

12. The flexible OLED display according to claim 10, wherein the second protective component is disposed on a surface of the buffer layer facing the supporting frame, two ends of the second protective component are respectively mounted on the supporting frame.

13. The flexible OLED display according to claim 10, wherein a thickness of the first protective component is same as a thickness of the second protective component.

14. The flexible OLED display according to claim 10, wherein a material of the hinge is a high-grade spring steel or a high elastic polymer.

15. The flexible OLED display according to claim 14, wherein the hinge comprises a support component and an axial component, the support component is fixedly connected to a side of the supporting frame, and the axial component is fixedly connected to a surface of the support component.

16. The flexible OLED display according to claim 15, wherein a shape of the axial component is spring-like.

* * * * *

UNITED STATES PATENT AND TRADEMARK OFFICE
CERTIFICATE OF CORRECTION

| | |
|---|---|
| PATENT NO. | : 10,651,241 B2 |
| APPLICATION NO. | : 16/092447 |
| DATED | : May 12, 2020 |
| INVENTOR(S) | : Xuesi Qin |

Page 1 of 1

It is certified that error appears in the above-identified patent and that said Letters Patent is hereby corrected as shown below:

On the Title Page

Insert Item (30):
-- Jul. 6, 2018 (CN)................. 201810734251.0 --

Signed and Sealed this
Fifteenth Day of September, 2020

Andrei Iancu
*Director of the United States Patent and Trademark Office*